US012640675B2

(12) United States Patent
Shimizu

(10) Patent No.: US 12,640,675 B2
(45) Date of Patent: May 26, 2026

(54) SEMICONDUCTOR APPARATUS

(71) Applicant: ROHM CO., LTD., Kyoto (JP)

(72) Inventor: Tatsuro Shimizu, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 146 days.

(21) Appl. No.: 18/438,967

(22) Filed: Feb. 12, 2024

(65) Prior Publication Data

US 2024/0204709 A1 Jun. 20, 2024

Related U.S. Application Data

(63) Continuation of application No. PCT/JP2022/030097, filed on Aug. 5, 2022.

(30) Foreign Application Priority Data

Aug. 16, 2021 (JP) ................................. 2021-132430

(51) Int. Cl.
*H02P 29/024* (2016.01)
*H03K 19/007* (2006.01)
(52) U.S. Cl.
CPC ......... *H02P 29/024* (2013.01); *H03K 19/007* (2013.01)
(58) Field of Classification Search
CPC ..... H02P 29/024; H03K 19/007; G01R 31/28; H10D 84/00; G01K 7/00
USPC .............................. 318/400.21, 400.01, 700
See application file for complete search history.

(56) References Cited

U.S. PATENT DOCUMENTS

| | | | | |
|---|---|---|---|---|
| 10,027,261 | B2 * | 7/2018 | Ishikawa | ............... F04D 29/661 |
| 10,298,165 | B2 * | 5/2019 | Suzuki | ................. H02P 29/032 |
| 11,101,765 | B1 * | 8/2021 | Lehman | ............. H02P 29/0241 |

FOREIGN PATENT DOCUMENTS

| | | |
|---|---|---|
| JP | 2017195654 A | 10/2017 |
| JP | 2018091741 A | 6/2018 |
| JP | 2021082094 A | 5/2021 |

OTHER PUBLICATIONS

PCT International Preliminary Report on Patentability, dated Feb. 13, 2024; and International Search Report with Written Opinion of the ISA for International Application No. PCT/JP2022/030097; Date of Mailing, Oct. 11, 2022; 17 pages.

* cited by examiner

*Primary Examiner* — David Luo
(74) *Attorney, Agent, or Firm* — CANTOR COLBURN LLP

(57) ABSTRACT

A first circuit has a predetermined function with an output that has a small dependence on a certain operation condition. A second circuit has the same function as that of the first circuit with an output that has a large dependence on the certain operation condition. When the first circuit is operating normally, the main circuit operates according to the output of the first circuit. The main circuit is capable of generating a detection signal that indicates the certain operation condition based on a relative relation between the output of the first circuit and the output of the second circuit.

18 Claims, 14 Drawing Sheets

Figure 1:
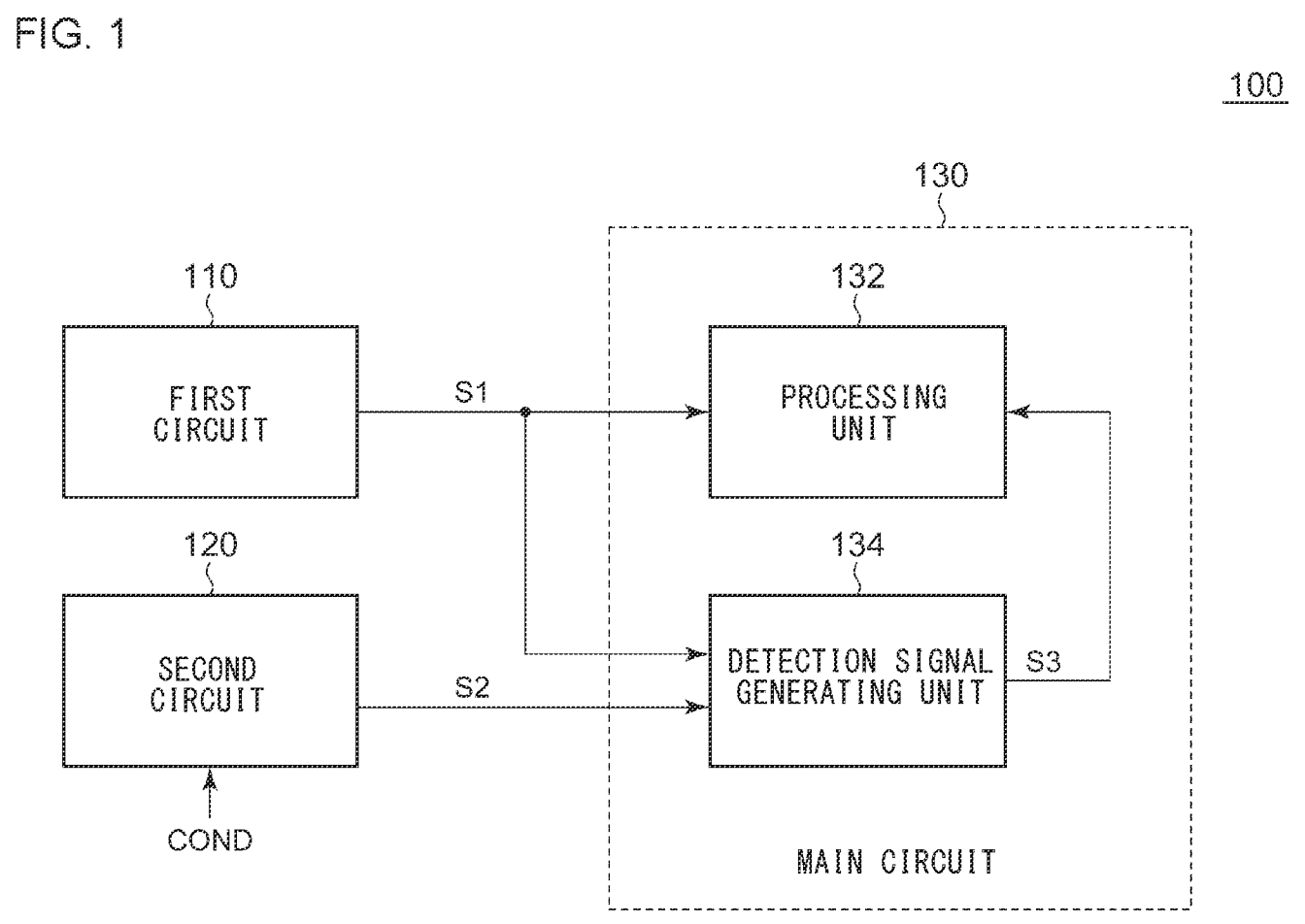

132    PROCESSING UNIT

134    DETECTION SIGNAL GENERATING UNIT    S3

MAIN CIRCUIT

110    FIRST CIRCUIT

120    SECOND CIRCUIT

COND

Figure 8:
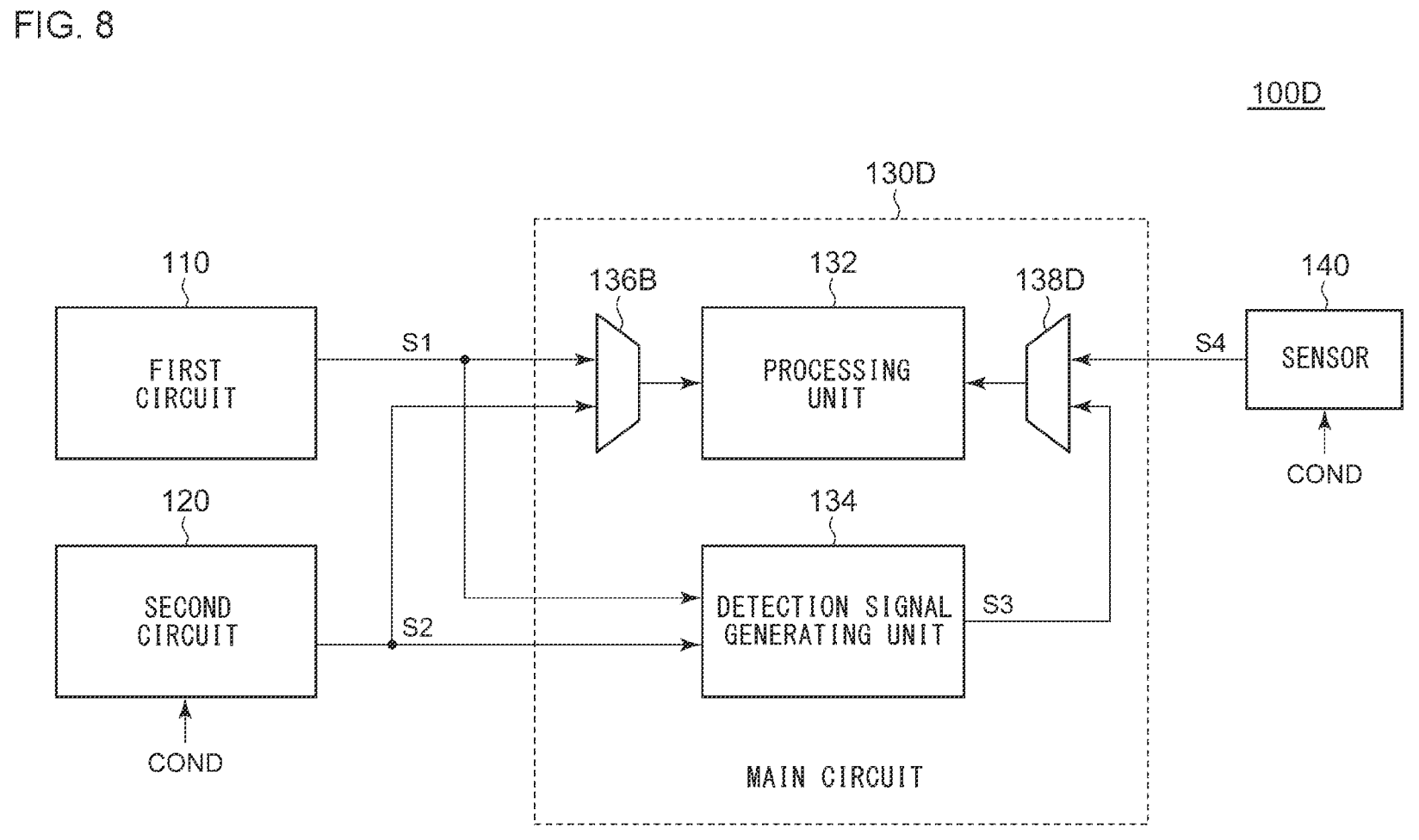

140 SENSOR ← COND

S4

130D MAIN CIRCUIT

138D

132 PROCESSING UNIT

134 DETECTION SIGNAL GENERATING UNIT

S3

136B

S1

S2

110 FIRST CIRCUIT

120 SECOND CIRCUIT ← COND

Figure 11:
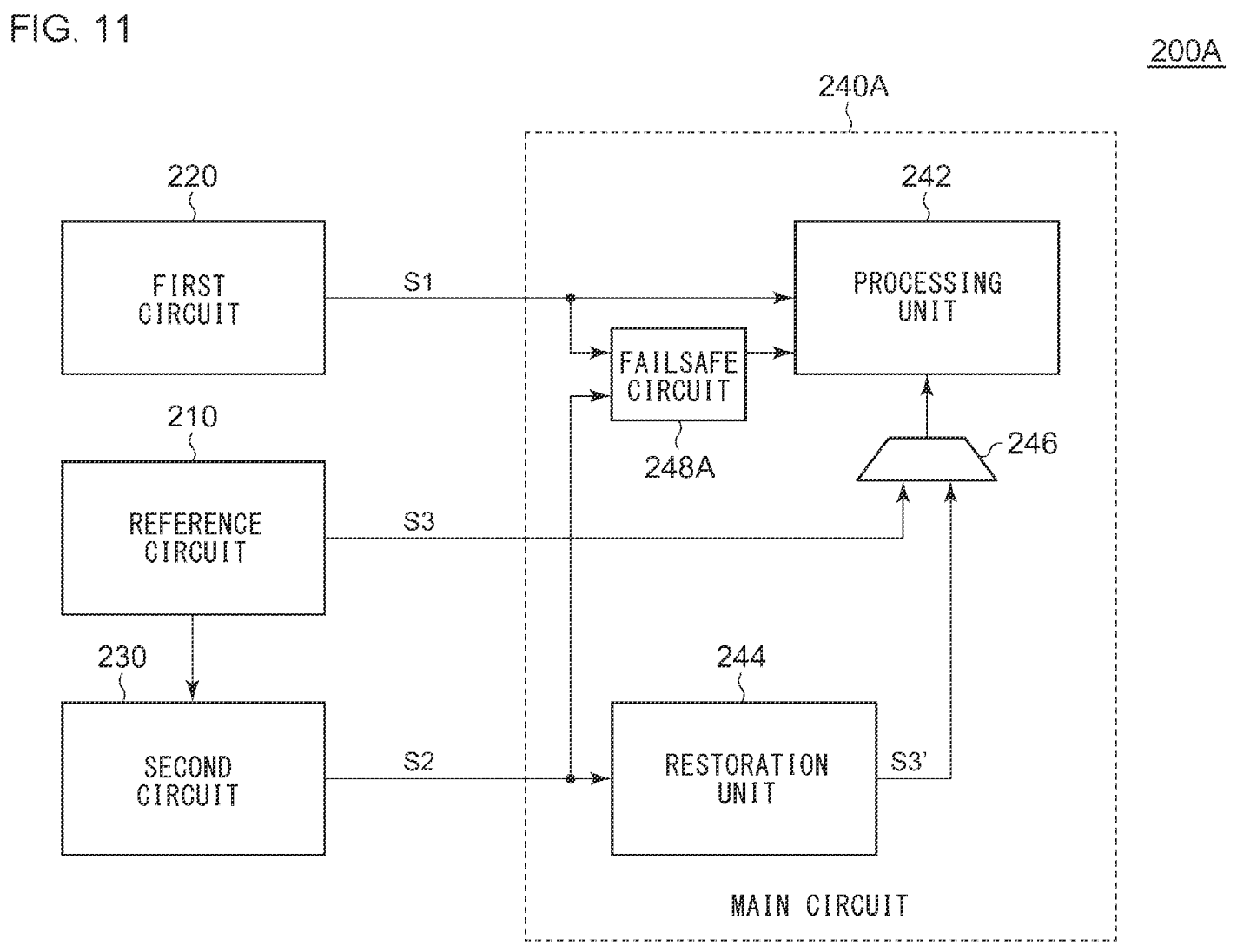

242 — PROCESSING UNIT

246

248A — FAILSAFE CIRCUIT

244 — RESTORATION UNIT

S3'

MAIN CIRCUIT

S1

S3

S2

220 — FIRST CIRCUIT

210 — REFERENCE CIRCUIT

230 — SECOND CIRCUIT

Figure 13:
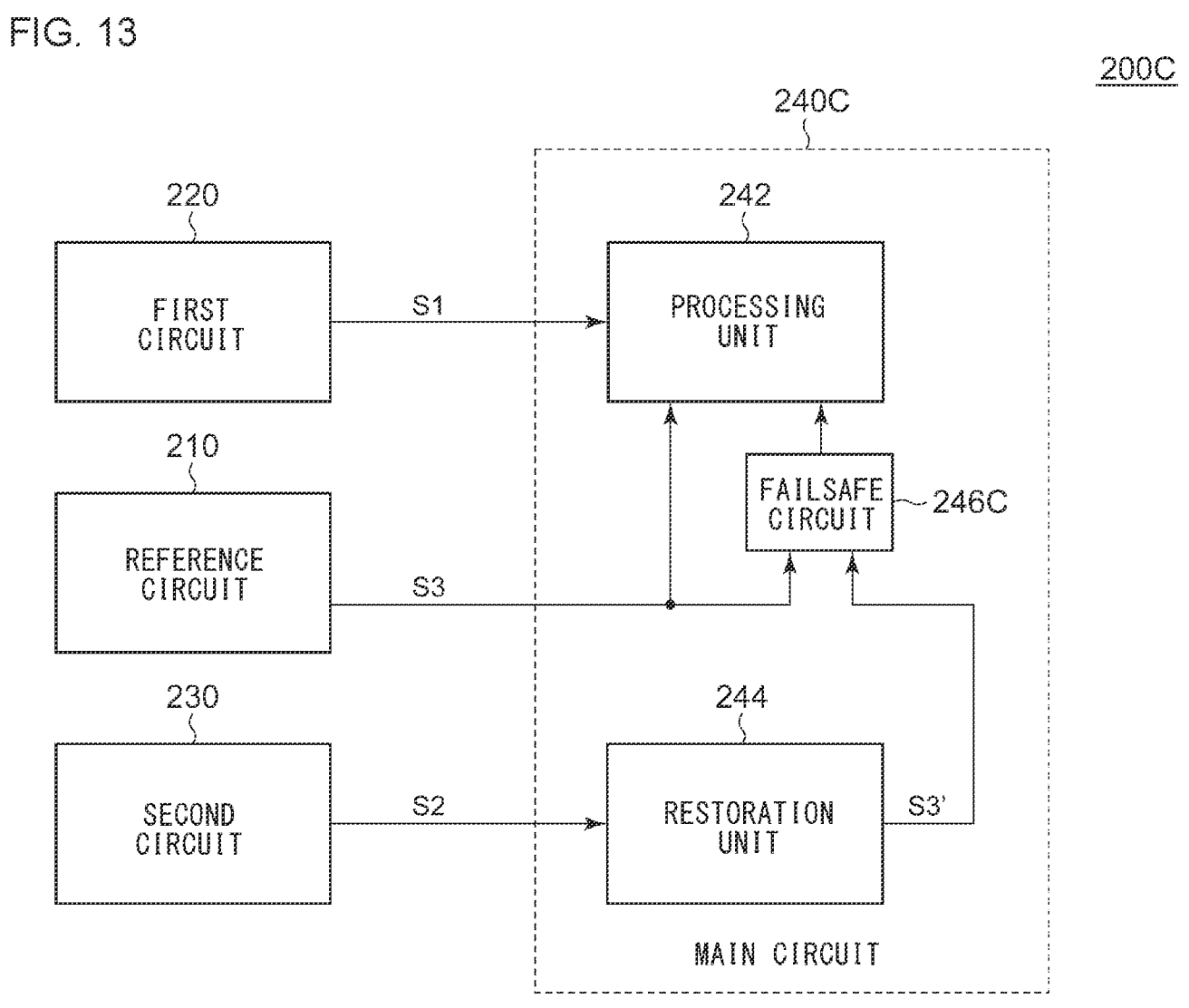

242 PROCESSING UNIT

246C FAILSAFE CIRCUIT

244 RESTORATION UNIT

MAIN CIRCUIT

220 FIRST CIRCUIT

210 REFERENCE CIRCUIT

230 SECOND CIRCUIT

SEMICONDUCTOR APPARATUS

CROSS REFERENCE TO RELATED APPLICATIONS

This application is a continuation under 35 U.S.C. § 120 of PCT/JP2022/030097, filed Aug. 5, 2022, which is incorporated herein by reference, and which claimed priority to Japanese Application No. 2021-132430, filed Aug. 16, 2021. The present application likewise claims priority under 35 U.S.C. § 119 to Japanese Application No. 2021-132430, filed Aug. 16, 2021, the entire content of which is also incorporated herein by reference.

BACKGROUND

1. Technical Field

The present disclosure relates to a semiconductor apparatus.

2. Related Art

In devices and systems employing electronic circuits, functional safety is an important issue. For example, in automobiles, in which the computerization of components has been advancing, the ISO 26262 standard has been established with respect to functional safety. In the ISO 26262 standard, a risk classification system referred to as the "Automotive Safety Integrity Level" (ASIL) has been defined. In the ASIL, four grades, i.e., "A", "B", "C", and "D", are defined for each component and for each function.

As a design method for functional safety, redundant design is well known, in which the function of an electronic circuit is duplicated. Such redundant design requires twice as many hardware components as an ordinary design. This leads to an unavoidable increase in costs. Furthermore, such a design involves an over-performance depending on the ASIL grade.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which:

FIG. 1 is a block diagram of a semiconductor apparatus according to an embodiment 1;

FIG. 6 is a circuit diagram of a modification of the semiconductor apparatus shown in FIG. 1;

FIG. 8 is a circuit diagram of a modification of the semiconductor apparatus shown in FIG. 1;

FIG. 10 is a circuit diagram of a semiconductor apparatus according to an example 3;

FIG. 11 is a circuit diagram of a modification of the semiconductor apparatus shown in FIG. 9;

FIG. 12 is a circuit diagram of a modification of the semiconductor apparatus shown in FIG. 9;

FIG. 13 is a circuit diagram of a modification of the semiconductor apparatus shown in FIG. 9; and FIG. 14 is a diagram showing a motor control system.

DETAILED DESCRIPTION

Outline of Embodiments

Figure 2:
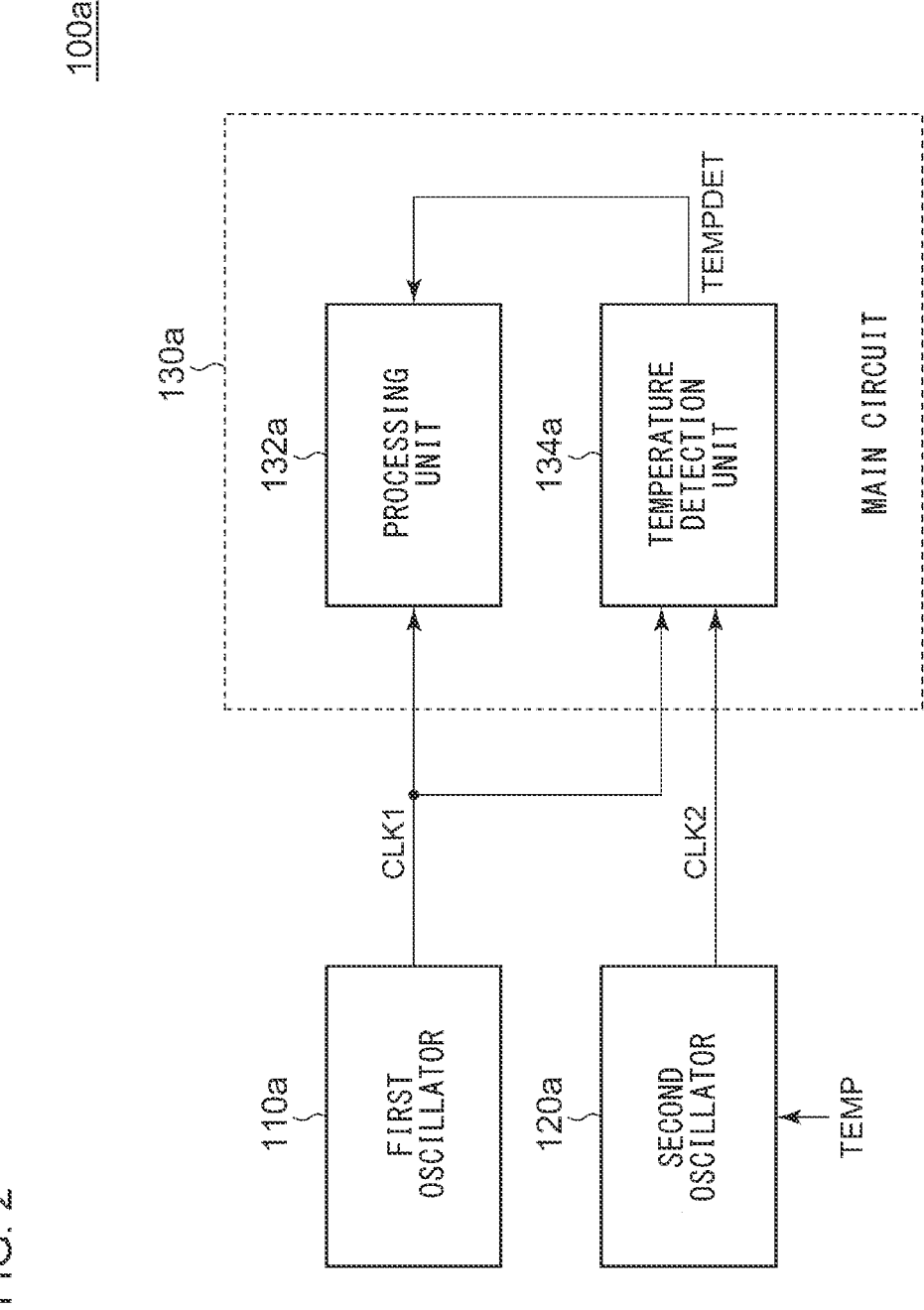
FIG. 2 is a circuit diagram of a semiconductor apparatus according to an example 1.

Description will be made regarding the outline of several exemplary embodiments of the present disclosure. The outline is a simplified explanation regarding several concepts of one or multiple embodiments as a preface to the detailed description described later in order to provide a basic understanding of the embodiments. That is to say, the outline described below is by no means intended to restrict the scope of the present invention and the present disclosure. Furthermore, the outline described below is by no means a comprehensive outline of all possible embodiments. That is to say, the outline is by no means intended to identify the indispensable or essential elements of all the embodiments and is by no means intended to define the scope of a part of or all the embodiments. For convenience, in some cases, an "embodiment" as used in the present specification represents a single or multiple embodiments (examples and modifications) disclosed in the present specification.

A semiconductor apparatus according to one embodiment includes: a first circuit having a predetermined function, structured to generate an output having a relative small dependence on a certain operation condition; a second circuit having the same function as the first circuit, structured to generate an output having a relative large dependence on the certain operation condition; and a main circuit structured (i) to operate according to the output of the first circuit when the first circuit operates normally, and (ii) to generate a detection signal indicative of the certain operation condition based on a relative relation between the output of the first circuit and the output of the second circuit.

With this arrangement employing two redundant circuits having the same predetermined function, this provides two functions, i.e., detection of the condition for the certain operation in addition to the predetermined function. Accordingly, this allows the two redundant circuits to have multiple functions as compared with an arrangement in which the two redundant circuits having the same predetermined function provide only a predetermined function.

In one embodiment, the second circuit may have a simplified structure as compared with that of the first circuit. This allows the circuit area to be reduced as compared with an arrangement in which the second circuit has the same configuration as that of the first circuit.

In one embodiment, the main circuit may be structured to monitor the output of the first circuit and the output of the second circuit so as to detect an abnormal state in the first circuit.

In one embodiment the main circuit may be structured to operate according to the output of the second circuit when an abnormal state has occurred in the first circuit. This ensures functional safety by duplication with respect to a predetermined function.

In one embodiment, the semiconductor apparatus may further include a sensor structured to detect the certain operation condition.

In one embodiment the main circuit may be structured to operate with reference to an output of the sensor when the sensor is operating normally. Also, the main circuit may be structured to detect an abnormal state in the sensor based on the relation between the detection signal and the output of the sensor.

In one embodiment the main circuit may be structured to use the output of the sensor as a reference when the sensor is operating normally. The main circuit may be structured to use the detection signal as a reference when an abnormal state has occurred in the sensor. This ensures functional safety by duplication with respect to a predetermined function.

In one embodiment, the certain operation condition may be temperature. This allows the first circuit and the second circuit to be used as a temperature sensor.

In one embodiment, the predetermined function may be generation of a clock signal. Also, the first circuit may be a first oscillator. Also, the second circuit may be a second oscillator. Also, the temperature dependence of an oscillation frequency of the second oscillator may be larger than that of the first oscillator. In this case, such an arrangement is capable of detecting the temperature based on the relation between the frequency of the output clock of the first oscillator and the frequency of the output clock of the second oscillator.

In one embodiment, the predetermined function may be generation of a constant voltage. Also, the first circuit may be a reference voltage source. Also, the second circuit may be a voltage source. Also, the temperature dependence of an output voltage of the voltage source may be larger than that of the reference voltage source. In this case, such an arrangement is capable of detecting the temperature based on the relation between the output voltage of the reference voltage source and the output voltage of the voltage source.

A semiconductor apparatus according to one embodiment includes: a reference circuit structured to generate a predetermined reference signal; a first circuit having a predetermined function, and structured to operate independently of the reference signal; a second circuit having the same function as that of the first circuit, and structured to generate an output that depends on the reference signal; and a main circuit structured (i) to operating according to an output of the first circuit and the reference signal when the first circuit and the reference circuit are operating normally, and (ii) to restore the reference signal from the output of the second circuit.

With this arrangement employing the two redundant circuits having the same predetermined function, this is capable of restoring the reference signal while providing the predetermined function.

In one embodiment, the main circuit may be structured to monitor the reference signal generated by the reference circuit and the restored reference signal so as to detect an abnormal state in the reference circuit. This allows the occurrence of an abnormal state in the reference circuit to be detected, thereby providing improved reliability.

In one embodiment, the main circuit may be structured to operate according to the restored reference signal when an abnormal state has occurred in the reference circuit. This provides a failsafe with respect to an abnormal state in the reference circuit.

In one embodiment, the main circuit may be structured to operate according to the output of the second circuit when an abnormal state has occurred in the first circuit. This ensures functional safety by duplication with respect to a predetermined function.

In one embodiment, the reference circuit may be a reference voltage source structured to generate a reference voltage. Also, the first circuit may be a first oscillator structured to generate a first clock signal. Also, the second circuit may be a second oscillator structured to generate a second clock signal having a time-average level that corresponds to the reference voltage. Also, the main circuit may be structured to smooth the second clock signal so as to restore the reference signal.

In one embodiment, the semiconductor apparatus may be monolithically integrated on a single semiconductor substrate. Examples of such an "integrated" arrangement include: an arrangement in which all the circuit components are formed on a semiconductor substrate; and an arrangement in which principal circuit components are monolithically integrated. Also, a part of the circuit components such as resistors or capacitors may be arranged in the form of components external to such a semiconductor substrate in order to adjust the circuit constants. By integrating the circuit on a single chip, such an arrangement allows the circuit area to be reduced and allows the circuit elements to have uniform characteristics.

EMBODIMENTS

Description will be made below regarding the preferred embodiments with reference to the drawings. The same or similar components, members, and processes are denoted by the same reference numerals, and redundant description thereof will be omitted as appropriate. The embodiments have been described for exemplary purposes only and are by no means intended to restrict the present disclosure or the present invention. Also, it is not necessarily essential for the present disclosure and the present invention that all the features or a combination thereof be provided as described in the embodiments.

In the present specification, the state represented by the phrase "the member A is coupled to the member B" includes a state in which the member A is indirectly coupled to the member B via another member that does not substantially affect the electric connection between them, or that does not damage the functions or effects of the connection between them, in addition to a state in which they are physically and directly coupled.

Similarly, the state represented by the phrase "the member C is provided between the member A and the member B" includes a state in which the member A is indirectly coupled to the member C, or the member B is indirectly coupled to the member C via another member that does not substantially affect the electric connection between them, or that does not damage the functions or effects of the connection between them, in addition to a state in which they are directly coupled.

Embodiment 1

FIG. 1 is a block diagram of a semiconductor apparatus 100 according to an embodiment 1. The semiconductor apparatus 100 includes a first circuit 110, a second circuit 120, and a main circuit 130. The semiconductor apparatus 100 may be configured such that all the components thereof are integrated on a single semiconductor substrate. Also, the components thereof may be integrated on multiple semiconductor substrates.

The first circuit 110 and the second circuit 120 have the same predetermined function. That is to say, the first circuit 110 and the second circuit 120 output a first signal S1 and a second signal S2, respectively, in order to provide the same function and the same purpose. The first circuit 110 outputs the first output signal S1 having a relatively small dependence on a certain operation condition COND. In contrast, the second circuit 120 outputs the second output signal S2 having a relatively large dependence on a certain operation condition COND. Examples of such an operation condition include temperature, power supply voltage, humidity, brightness, elapsed time from the start of operation, magnetic field, electric field, etc.

The main circuit 130 includes a processing unit 132 that operates according to the output S1 of the first circuit 110 when the first circuit 110 is operating normally.

Furthermore, the main circuit 130 includes a detection signal generating unit 134 that is capable of generating a detection signal S3 that indicates a predetermined operation condition COND based on a relative relation between the first signal S1 output from the first circuit 110 and the second signal S2 output from the second circuit 120.

The detection signal S3 generated by the detection signal generating unit 134 is referenced by the processing unit 132. The processing unit 132 is capable of monitoring the operation condition COND and executing signal processing with reference to the operation condition COND based on the detection signal S3.

The above is the basic configuration of the semiconductor apparatus 100. With the semiconductor apparatus 100, the two redundant circuits 110 and 120 having the same function provide two functions, i.e., the predetermined function and detection of the predetermined operation condition COND.

With a system having the two redundant circuits each having the same function in order to provide a predetermined function in duplicate, such an arrangement provides only a single function using the two circuits. In contrast, with the present embodiment, such redundant circuits provide multiple functions.

Next, description will be made regarding a specific example configuration of the semiconductor apparatus 100 shown in FIG. 1. FIG. 2 is a circuit diagram of a semiconductor apparatus 100a according to an embodiment 1. The semiconductor apparatus 100a includes a first oscillator 110a, a second oscillator 120a, and a main circuit 130a. The first oscillator 110a, the second oscillator 120a, and the main circuit 130a correspond to the first circuit 110, the second circuit 120, and the main circuit 130, shown in FIG. 1, respectively.

In this example, the predetermined function is defined as the generation of a clock signal. Furthermore, the predetermined operation condition COND is defined as the temperature TEMP. The first oscillator 110a generates a first clock signal CLK1. The first clock signal CLK1 is employed as a system clock of the processing unit 132. The first oscillator 110a is designed such that the oscillation frequency has a small temperature dependence.

The second oscillator 120a generates a second clock signal CLK2. The second oscillator 120a is designed such that the oscillation frequency has a temperature dependence that is larger than that of the first oscillator 110a. That is to say, the second oscillator 120a is designed to allow temperature variation.

Figure 3:
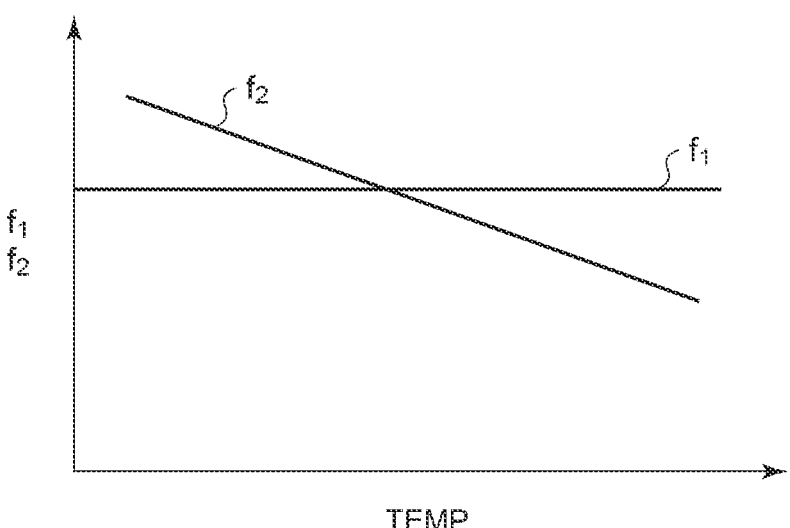
FIG. 3 is a diagram showing the temperature dependence of the frequencies of a first clock signal and a second clock signal.

FIG. 3 is a diagram showing a temperature dependence of the frequency f1 of the first clock signal CLK1 and of the frequency f2 of the second clock signal CLK2. It should be noted that the second clock signal CLK2 provides the frequency f2 having a negative temperature coefficient. Also, the frequency f2 of the second clock signal CLK2 may have a positive temperature coefficient.

Returning to FIG. 2, the main circuit 130a includes a processing unit 132a and a temperature detection unit 134a. The processing unit 132a and the temperature detection unit 134a correspond to the processing unit 132 and the detection signal generating unit 134 shown in FIG. 1.

The processing unit 132a executes predetermined signal processing with the first clock signal CLK1 as a system clock.

The temperature detection unit 134a receives the first clock signal CLK1 and the second clock signal CLK2. The temperature detection unit 134a detects the temperature TEMP based on the relation between the frequency f1 of the first clock signal CLK1 and the frequency f2 of the second clock signal CLK2, and generates a temperature detection signal TEMPDET that indicates the temperature TEMP. The temperature detection signal TEMPDET corresponds to the detection signal S3 shown in FIG. 1. For example, a relation between the temperature TEMP and the difference between the frequencies f1 and f2, i.e., $\Delta f = f1 - f2$, may be measured beforehand. Also, the temperature detection unit 134a may hold the relation thus measured as a table or an expression. Also, a relation between the temperature TEMP and the ratio between the frequencies f1 and f2, i.e., $r = f2/f1$, may be measured beforehand. Also, the temperature detection unit 134a may hold the relation thus measured as a table or an expression.

The processing unit 132a monitors the temperature TEMP based on the temperature detection signal TEMPDET, and executes signal processing with reference to the temperature TEMP.

With the semiconductor apparatus 100 shown in FIG. 2 employing the first oscillator 110a and the second oscillator 120a, such an arrangement is capable of providing two functions, i.e., a function of supplying s system clock and a function of detecting the temperature.

In general, it is difficult to design a circuit having a small temperature dependence. This leads to an increase in the circuit scale. In other words, the second oscillator 120a can be designed to allow temperature dependence. This allows the second oscillator 120a to be designed to have a circuit that is simpler than that of the first oscillator 110a, and that has a smaller circuit area. Accordingly, this is capable of suppressing an increase in the overall circuit area as compared with an arrangement provided with two circuits each having a small temperature dependence.

Figure 4:
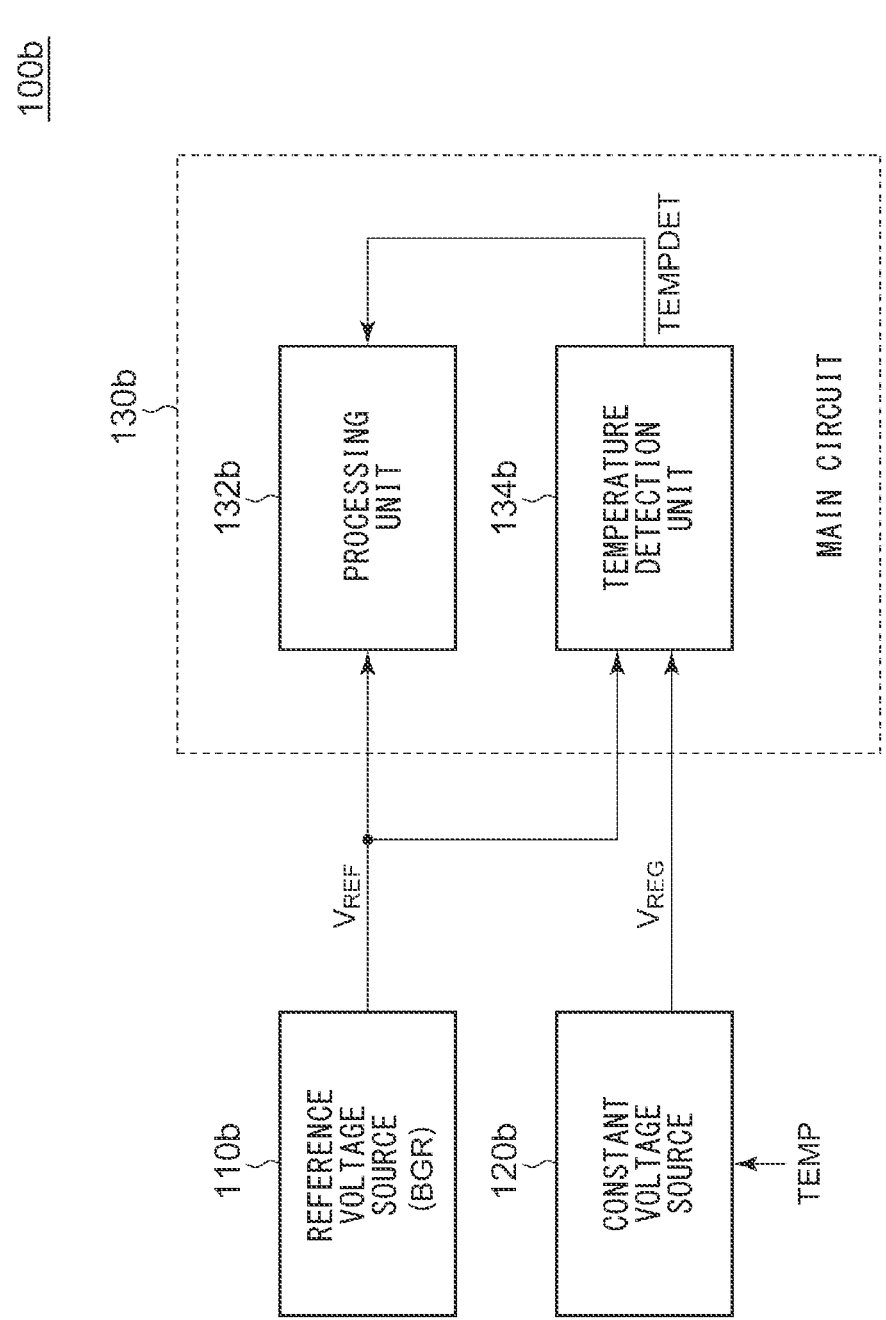
FIG. 4 is a circuit diagram of a semiconductor apparatus according to an example 2.

FIG. 4 is a circuit diagram of a semiconductor apparatus 100b according to an example 2. The semiconductor apparatus 100b includes a reference voltage source 110b, a constant voltage source 120b, and a main circuit 130b. The reference voltage source 110b, the constant voltage source 120b, and the main circuit 130b correspond to the first circuit 110, the second circuit 120, and the main circuit 130, shown in FIG. 1, respectively.

In this example, the predetermined function is defined as the generation of a constant voltage. Furthermore, the predetermined operation condition COND is defined as the temperature TEMP. The reference voltage source 110b includes a bandgap reference circuit configured to generate a reference voltage $V_{REF}$ having a small temperature dependence, for example. The reference voltage $V_{REF}$ corresponds to the first signal S1 shown in FIG. 1.

The constant voltage source 120b generates a constant voltage $V_{REG}$ having substantially the same level as that of the reference voltage $V_{REF}$. The temperature characteristics of the constant voltage $V_{REG}$ generated by the constant voltage source 120b are poor as compared with the reference voltage $V_{REF}$. That is to say, the temperature characteristics of the constant voltage $V_{REG}$ are designed to allow temperature variation. In other words, the constant voltage $V_{REG}$ has temperature dependence. The constant voltage $V_{REG}$ corresponds to the second signal S2 shown in FIG. 1. The constant voltage $V_{REG}$ may have a positive temperature coefficient. Also, the constant voltage $V_{REG}$ may have a negative temperature coefficient.

The main circuit 130b includes a processing unit 132b and a temperature detection unit 134b. The processing unit 132b and the temperature detection unit 134b correspond to the processing unit 132 and the detection signal generating unit 134 shown in FIG. 1.

The processing unit 132b executes predetermined signal processing with the reference voltage $V_{REF}$ as a reference. For example, the reference voltage $V_{REF}$ is used as a reference voltage for an A/D converter or a D/A converter. Also, the reference voltage $V_{REF}$ is referenced as a target level for feedback control.

The temperature detection unit 134b receives the reference voltage $V_{REF}$ and the constant voltage $V_{REG}$. The temperature detection unit 134b detects the temperature TEMP based on the relation between the reference voltage $V_{REF}$ and the constant voltage $V_{REG}$, and generates a temperature detection signal TEMPDET that indicates the temperature TEMP. The temperature detection signal TEMP-DET corresponds to the detection signal S3 shown in FIG. 1. For example, a relation between the temperature TEMP and the difference between the voltages $V_{REF}$ and $V_{REG}$, i.e., $\Delta V = V_{REF} - V_{REG}$ may be measured beforehand. Also, the temperature detection unit 134b may hold the relation thus measured as a table or an expression. Also, the relation between the temperature and the ratio between the voltages $V_{REF}$ and $V_{REG}$, i.e., $r = V_{REG}/V_{REF}$, may be measured beforehand. Also, the temperature detection unit 134b may hold the relation thus measured as a table or an expression.

The processing unit 132b monitors the temperature TEMP based on the temperature detection signal TEMPDET, and executes signal processing with reference to the temperature TEMP.

Next, description will be made regarding modifications of the semiconductor apparatus 100.

Modification 1

Figure 5:
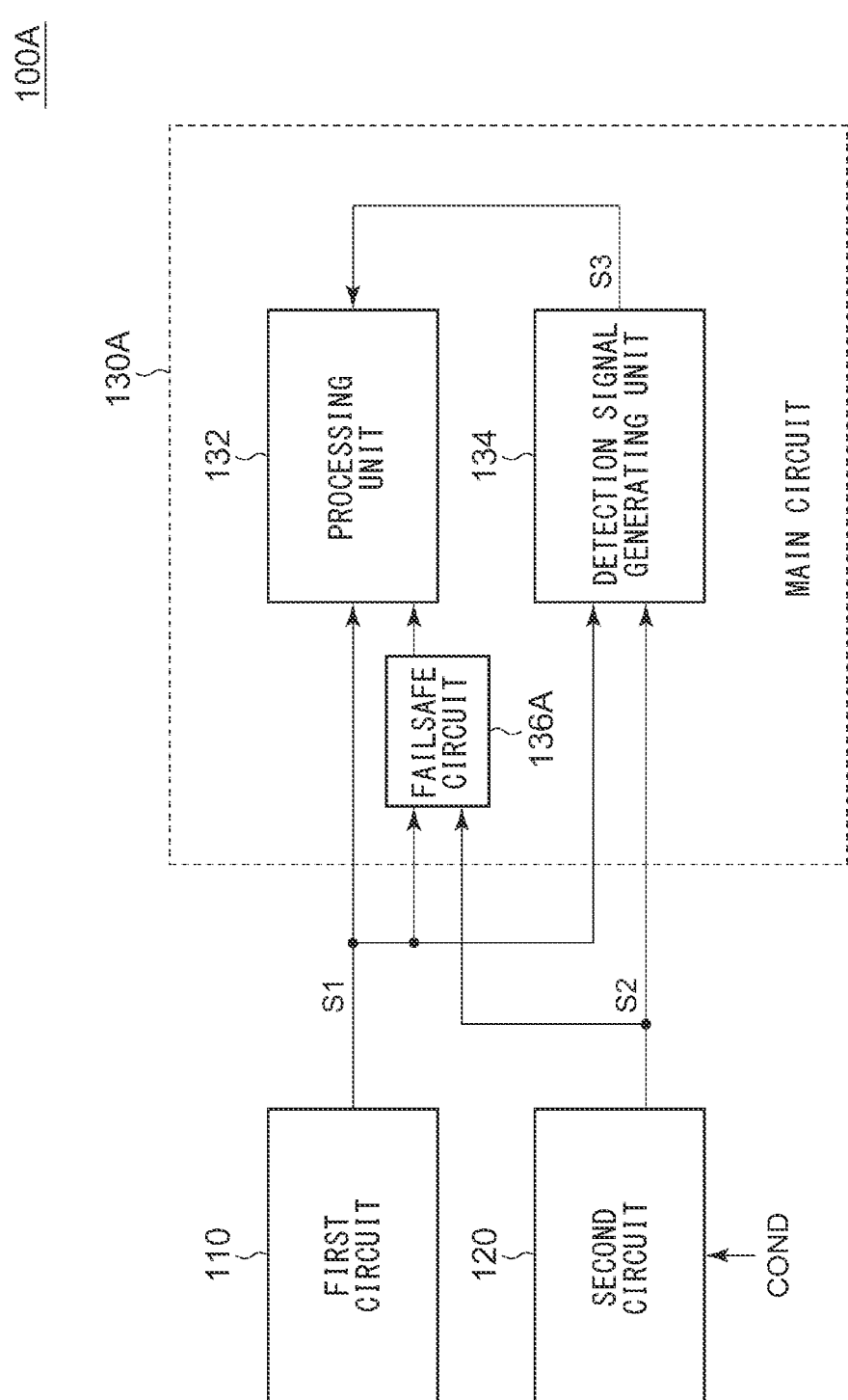
FIG. 5 is a circuit diagram of a modification of the semiconductor apparatus shown in FIG. 1.

FIG. 5 is a circuit diagram of a modification (100A) of the semiconductor apparatus 100 shown in FIG. 1. In this modification, the main circuit 130A includes a failsafe circuit 136A that judges the presence or absence of an abnormal state in the first circuit 110.

The failsafe circuit 136A is configured as an abnormal state detector that detects an abnormal state in the first circuit 110 by reciprocal monitoring of a first signal S1 and a second signal S2.

For example, the failsafe circuit 136A generates an expected value range for the first signal S1 based on the second signal S2. When the first signal S1 is within the expected value range, the failsafe circuit 136A judges that the first circuit 110 is operating normally. Conversely, when the first signal S1 is not within the expected value range, the failsafe circuit 136A judges that an abnormal state has occurred in the first circuit 110.

With this arrangement, this allows an abnormal state in the first circuit 110 to be detected, thereby providing improved safety.

Modification 2

Figure 6:
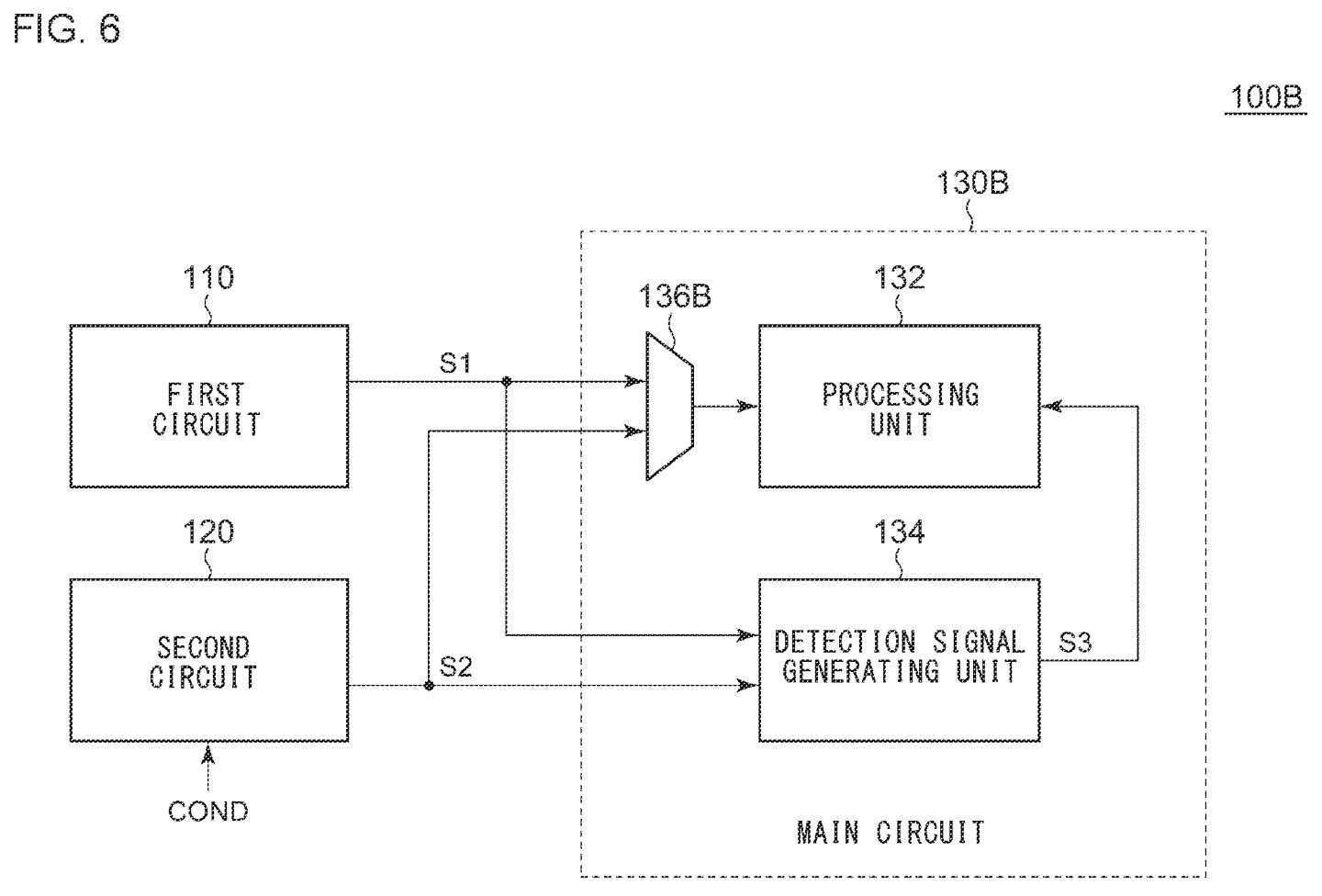

FIG. 6 is a circuit diagram of a modification (100B) of the semiconductor apparatus 100 shown in FIG. 1. With this modification, when an abnormal state has occurred in the first circuit 110, the processing unit 132 of the main circuit 130B operates according to the second signal S2 generated by the second circuit 120 instead of the first signal S1 generated by the first circuit 110.

The main circuit 130B includes a failsafe circuit 136B. The failsafe circuit 136B receives the first signal S1 and the second signal S2. During a period in which the first circuit 110 is operating normally, the failsafe circuit 136B supplies a first signal S1 to the processing unit 132. When an abnormal state has occurred in the first circuit 110, the failsafe circuit 136B supplies the second signal S2 to the processing unit 132.

The detection method used in the failsafe circuit 136B to detect an abnormal state in the first circuit 110 is not restricted in particular. For example, the failsafe circuit 136B may detect an abnormal state in the first circuit 110 by reciprocal monitoring of the first signal S1 and the second signal S2 in the same manner as with the failsafe circuit 136A shown in FIG. 5. Also, the failsafe circuit 136B may monitor the first signal S1. In this case, the failsafe circuit 136B may detect an abnormal state in the first circuit 110 based on the loss of the first signal S1, or based on whether the characteristics thereof (e.g., frequency, signal level, duty cycle) are within a normal range.

With the semiconductor apparatus 100B shown in FIG. 6, this ensures functional safety by duplication with respect to a predetermined function supported by the first circuit 110.

Modification 3

Figure 7:
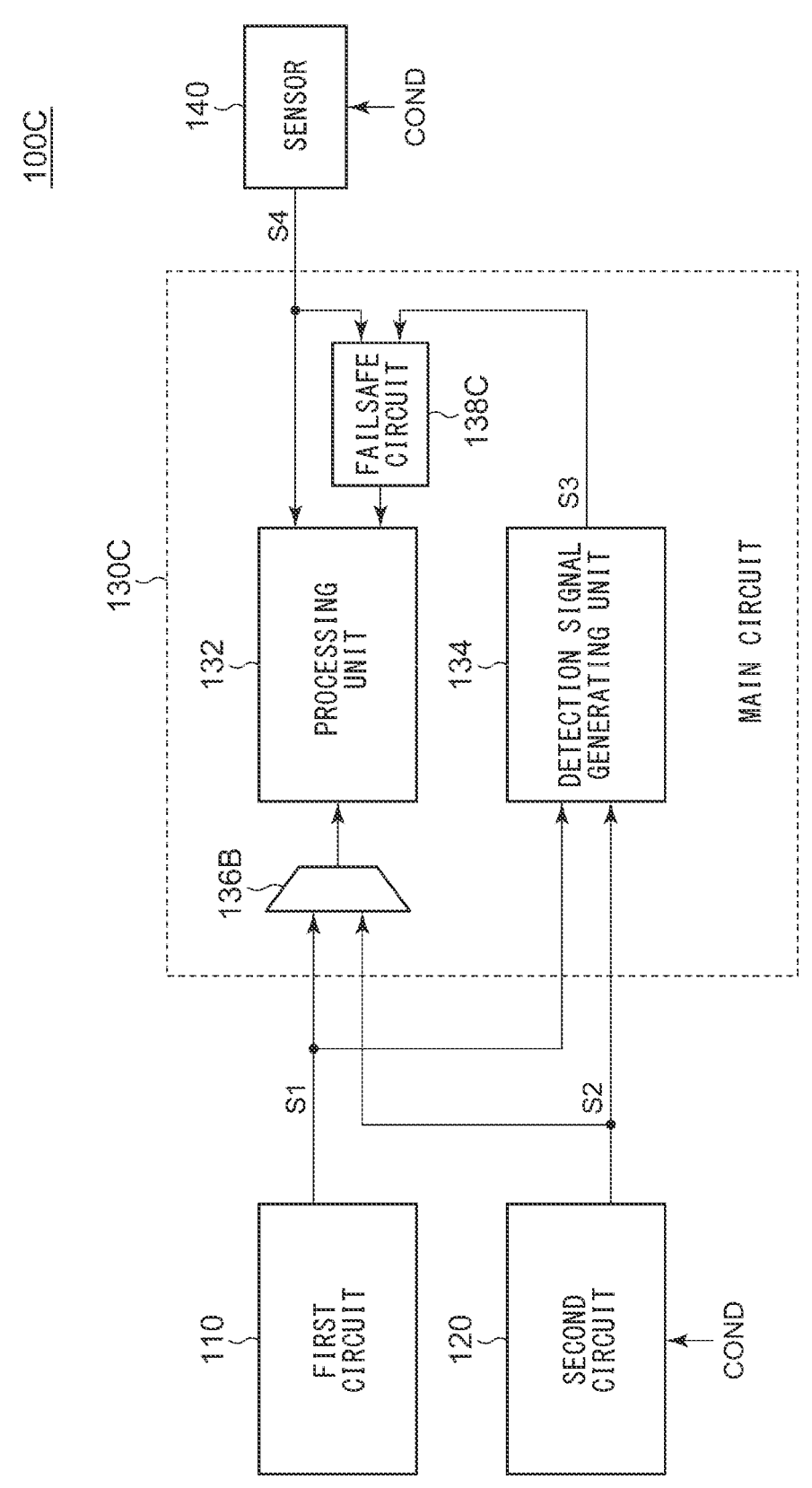
FIG. 7 is a circuit diagram of a modification of the semiconductor apparatus shown in FIG. 1.

FIG. 7 is a circuit diagram of a modification (100C) of the semiconductor apparatus 100 shown in FIG. 1. The semiconductor apparatus 100B further includes a sensor 140. The sensor 140 detects the operation condition COND on which the second circuit 120 is dependent, and generates a detection signal S4 that indicates the operation condition COND. For example, in a case in which the operation condition COND is defined as temperature, the sensor 140 is configured as a temperature sensor. The processing unit 132 monitors the operation condition COND based on the detection signal S4, and executes signal processing with reference to the operation condition COND.

The main circuit 130C includes a failsafe circuit 138C. The failsafe circuit 138C executes reciprocal monitoring of the detection signals S3 and S4, so as to detect an abnormal state in the sensor 140.

For example, the failsafe circuit 138C may generate an expected value range based on a value indicated by the detection signal S3. When the value indicated by the detection signal S4 is within the expected value range, the failsafe circuit 138C may judge that the sensor 140 is operating normally. Conversely, when the value indicated by the detection signal S4 is not within the expected value range, the failsafe circuit 138C may judge that an abnormal state has occurred in the sensor 140.

With this arrangement, this is capable of detecting an abnormal state in the sensor 140, thereby providing improved safety.

Modification 4

FIG. 8 is a circuit diagram of a modification (100D) of the semiconductor apparatus 100 shown in FIG. 1. A main circuit 130D includes a failsafe circuit 138D. The failsafe circuit 138D receives the detection signal S4 from the sensor 140 and the detection signal S3 from the detection signal generating unit 134. During a period in which the sensor 140 is operating normally, the failsafe circuit 138D supplies the detection signal S4 to the processing unit 132. In a case in which an abnormal state has occurred in the sensor 140, the failsafe circuit 138D supplies the detection signal S3 to the processing unit 132.

The method for detecting an abnormal state in the sensor 140 supported by the failsafe circuit 138D is not restricted in particular. For example, in the same manner as the failsafe circuit 138C shown in FIG. 7, the failsafe circuit 138D may execute reciprocal monitoring of the detection signal S3 and the detection signal S4, so as to detect an abnormal state in the sensor 140. Specifically, the failsafe circuit 138D may generate an expected value range based on a value indicated by the detection signal S3. When a value indicated by the detection signal S4 is within the expected value range, the failsafe circuit 138D may judge that the sensor 140 is operating normally. Conversely, when the value indicated by the detection signal S4 is not within the expected value range, the failsafe circuit 138D may judge that an abnormal state has occurred in the sensor 140.

Also, the failsafe circuit 138D may monitor the detection signal S4 so as to detect an abnormal state in the sensor 140 based on the loss of the detection signal S4 or based on whether the value (signal level or amount) of the detection signal S4 is within a normal range.

With the semiconductor apparatus 100D shown in FIG. 8, this ensures functional safety by duplication with respect to a predetermined function supported by the first circuit 110. Furthermore, with the semiconductor apparatus 100D, this ensures functional safety by duplication with respect to sensing of the operation condition COND.

It should be noted that, in a case in which the detection signal generating unit 134 generates the detection signal S3 with sufficiently high accuracy, the detection signal S3 may be employed as a main signal, and a signal provided by the sensor 140 may be employed as a backup signal. That is to say, when the first circuit 110 and the second circuit 120 are operating normally, and accordingly, when the detection signal S3 is generated correctly, the failsafe circuit 138 may supply the detection signal S3 to the processing unit 132. Conversely, when the reliability of the detection signal S3 has decreased, i.e., when an abnormal state has occurred in at least one of the first circuit 110 and the second circuit 120, the failsafe circuit 138 may supply the detection signal S4 generated by the sensor 140 to the processing unit 132. During a period in which the detection signal S3 is supplied to the processing unit 132, the operation of the sensor 140 may be stopped, thereby allowing power consumption to be reduced.

Modification 5

In addition, an arrangement may be effectively made having the same configuration as that of the semiconductor apparatus 100D shown in FIG. 8, except that the failsafe circuit 136B is omitted. Also, an arrangement may be effectively made having the same configuration as that of the semiconductor apparatus 100D shown in FIG. 8 except that the failsafe circuit 136B is replaced by the failsafe circuit 136A.

Embodiment 2

Figure 9:
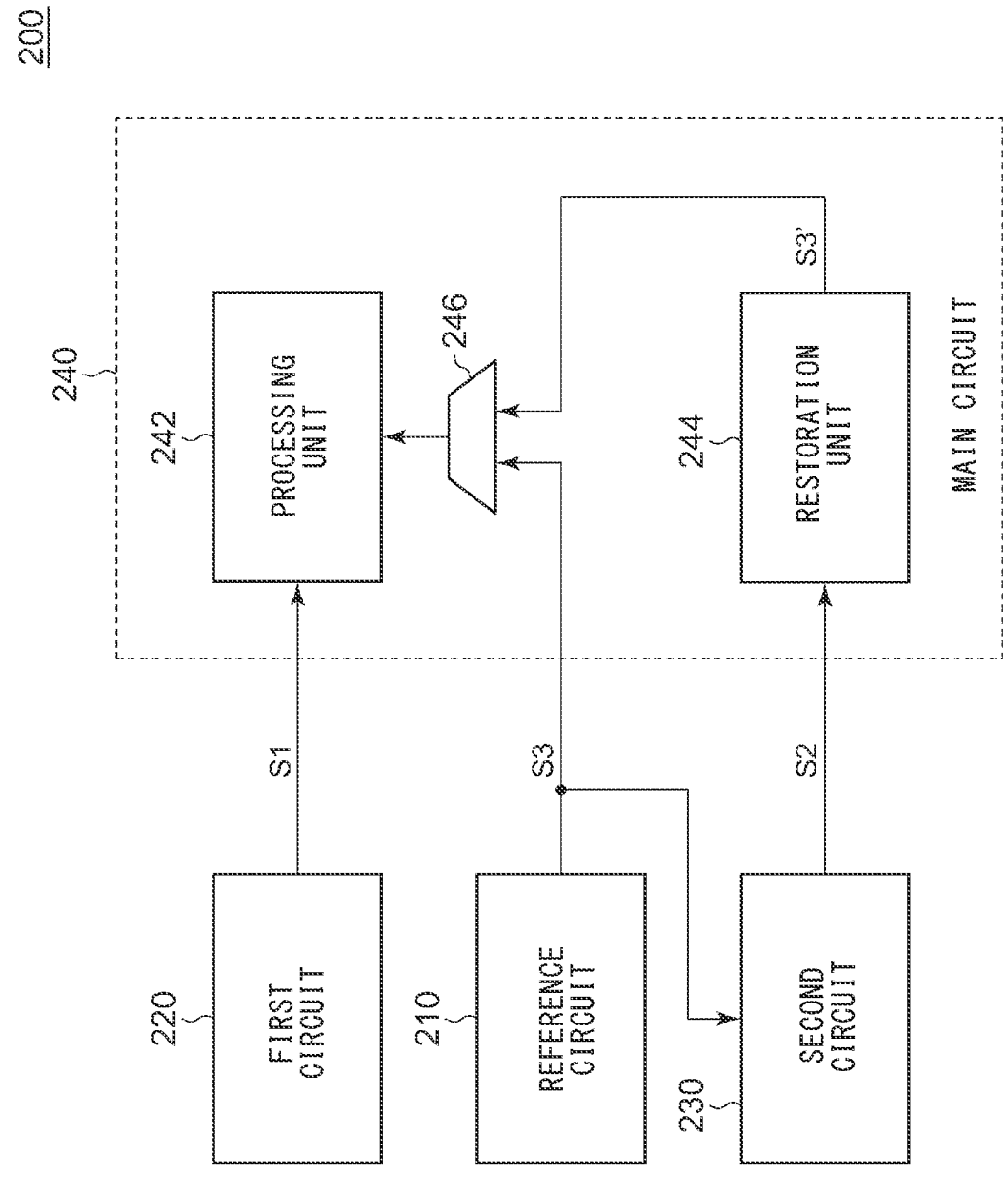
FIG. 9 is a block diagram of a semiconductor apparatus according to an embodiment 2.

FIG. 9 is a block diagram of a semiconductor apparatus 200 according to an embodiment 2. The semiconductor apparatus 200 includes a reference circuit 210, a first circuit 220, a second circuit 230, and a main circuit 240. All the components of the semiconductor apparatus 200 may be integrated on a single semiconductor substrate. Also, the components of the semiconductor apparatus 200 may be divided into multiple separate substrates.

The reference circuit 210 generates a predetermined reference signal S3. The reference signal S3 may be a voltage signal or a current signal. In the semiconductor apparatus 200 according to the embodiment 2, the reference signal S3 may be designed such that it corresponds to the operation condition COND in the embodiment 1.

The first circuit 220 and the second circuit 230 generate a first signal S1 and a second signal S2, respectively, for the same function and purpose. The first circuit 220 operates without depending on the reference signal S3. Accordingly, the first signal S1, which is an output of the first circuit 220, does not depend on the reference signal S3. The operation of the second circuit 230 depends on the reference signal S3. Accordingly, the second signal S2, which is an output of the second circuit 230, depends on the reference signal S3.

When the first circuit 220 and the reference circuit 210 are operating normally, the main circuit 240 operates according to the first signal S1, which is an output of the first circuit 110, and the reference signal S3. When an abnormal state has occurred in the reference circuit 210, the main circuit 240 is capable of restoring the reference signal S3 based on the second signal S2, which is an output of the second circuit 120. Furthermore, the main circuit 240 is capable of operating according to the reference signal S3' thus restored.

The main circuit 240 includes a processing unit 242, a restoration unit 244, and a failsafe circuit 246.

The restoration unit 244 receives the second signal S2 and restores the reference signal S3'.

The failsafe circuit 246 receives the reference signal S3 generated by the reference circuit 210 and the reference signal S3' restored by the restoration unit 244. During a period in which the reference circuit 210 is operating normally, the failsafe circuit 246 supplies the reference signal S3 to the processing unit 242. When an abnormal state has occurred in the reference circuit 210, the failsafe circuit 246 supplies the reference signal S3' to the processing unit 132.

The detection method supported by the failsafe circuit 246 for detecting an abnormal state in the reference circuit 210 is not restricted in particular. For example, the failsafe circuit 246 executes reciprocal monitoring of the reference signal S3 and the reference signal S3', so as to detect an abnormal state in the reference circuit 210. For example, the failsafe circuit 246 generates an expected value range of the reference signal S3 based on the reference signal S3'. When the reference signal S3 is within the expected value range, the failsafe circuit 246 judges that the reference circuit 210 is operating normally. Conversely, when the reference signal S3 is not within the expected value range, the failsafe circuit 246 judges that an abnormal state has occurred in the reference circuit 210.

Also, the failsafe circuit 246 may monitor the reference signal S3 and may detect an abnormal state in the reference circuit 210 based on the loss of the reference signal S3 or whether or not the signal characteristic (e.g., frequency, signal level, duty cycle) of the reference signal S3 is within a normal range.

The above is the configuration of the semiconductor apparatus 200. With the semiconductor apparatus 200 employing the two redundant circuits 220 and 230 each having the same predetermined function, this is capable of providing a predetermined function with functional safety against the loss of the reference signal S3.

Figure 10:
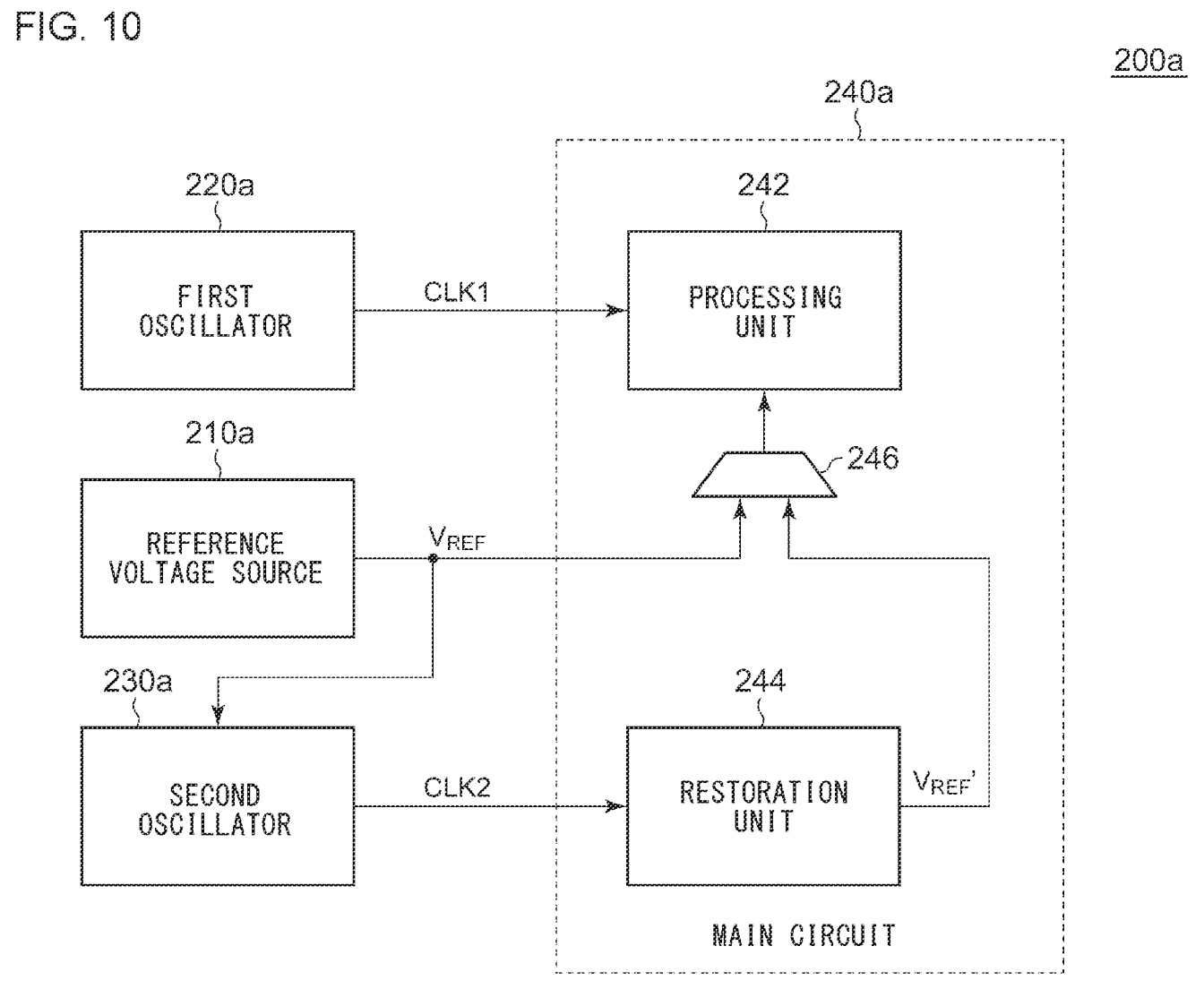

Next, description will be made regarding a specific configuration example of the semiconductor apparatus 200 shown in FIG. 9. FIG. 10 is a circuit diagram of a semiconductor apparatus 200a according to an example 3. The semiconductor apparatus 200a includes a reference voltage source 210a, a first oscillator 220a, a second oscillator 230a, and a main circuit 240a. The reference voltage source 210a, the first oscillator 220a, the second oscillator 230a, and the main circuit 240a correspond to the reference circuit 210, the first circuit 220, the second circuit 230, and the main circuit 240 shown in FIG. 9, respectively.

In this example, the predetermined function is the generation of the clock signal. Furthermore, the reference voltage source 210a generates a reference voltage $V_{REF}$ having a predetermined voltage level. The first oscillator 220a and the second oscillator 230a generate the first clock signal CLK1 and the second clock signal CLK2 having the same frequency. The second clock signal CLK2 has a voltage level such that its time average corresponds to the reference voltage $V_{REF}$.

For example, the second clock signal CLK2 may be designed with a constant duty cycle and an amplitude that corresponds to the reference voltage $V_{REF}$. For example, the second clock signal CLK2 may have an amplitude that is proportional to the reference voltage $V_{REF}$.

Also, the second clock signal CLK2 may be designed with a constant amplitude and a duty cycle that corresponds to the reference voltage $V_{REF}$. For example, the second clock signal CLK2 may have a duty cycle that is proportional to the reference voltage $V_{REF}$.

The main circuit 240a includes a processing unit 242, a failsafe circuit 246, and a restoration unit 244. The restoration unit 244 is capable of restoring the reference signal $V_{REF}$ by smoothing the second clock signal CLK2. The restoration unit 244 may include a low-pass filter, for example.

Also, in a case in which the second clock signal CLK2 has an amplitude that corresponds to the reference voltage $V_{REF}$, the restoration unit 244 may sample and hold the amplitude (high level) of the second clock signal CLK2.

Also, in a case in which the second clock signal CLK2 has a duty cycle that corresponds to the reference voltage $V_{REF}$, the restoration unit 244 may measure the pulse width of the second clock signal CLK2 and may generate a reference voltage $V_{REF}'$ that corresponds to the pulse width.

The failsafe circuit 246 receives the reference voltage $V_{REF}$ from the reference voltage source 210a and the reference voltage $V_{REF}'$ from the restoration unit 244. When the reference voltage source 210a is operating normally, the reference voltage $V_{REF}$ is supplied to the processing unit 242. When an abnormal state has occurred in the reference voltage source 210a, the reference voltage $V_{REF}'$ is supplied to the processing unit 242. With this, the reference voltage $V_{REF}$ Or $V_{REF}'$ is always supplied to the processing unit 242.

Next, description will be made regarding modifications of the semiconductor apparatus 200.

Modification 1

FIG. 11 is a circuit diagram of a modification (200A) of the semiconductor apparatus 200 shown in FIG. 9. In this modification, the main circuit 240A includes a failsafe circuit 248A that judges the presence or absence of an abnormal state in the first circuit 220.

The failsafe circuit 248A executes reciprocal monitoring of the first signal S1 and the second signal S2, so as to detect an abnormal state in the first circuit 220.

For example, the failsafe circuit 248A generates an expected value range of the first signal S1 based on the second signal S2. When the first signal S1 is within the expected value range, the failsafe circuit 248A judges that the first circuit 220 is operating normally. Conversely, when the first signal S1 is not within the expected value range, the failsafe circuit 248A judges that an abnormal state has occurred in the first circuit 220.

With this arrangement, this is capable of detecting an abnormal state in the first circuit 220, thereby providing improved safety.

Modification 2

Figure 12:
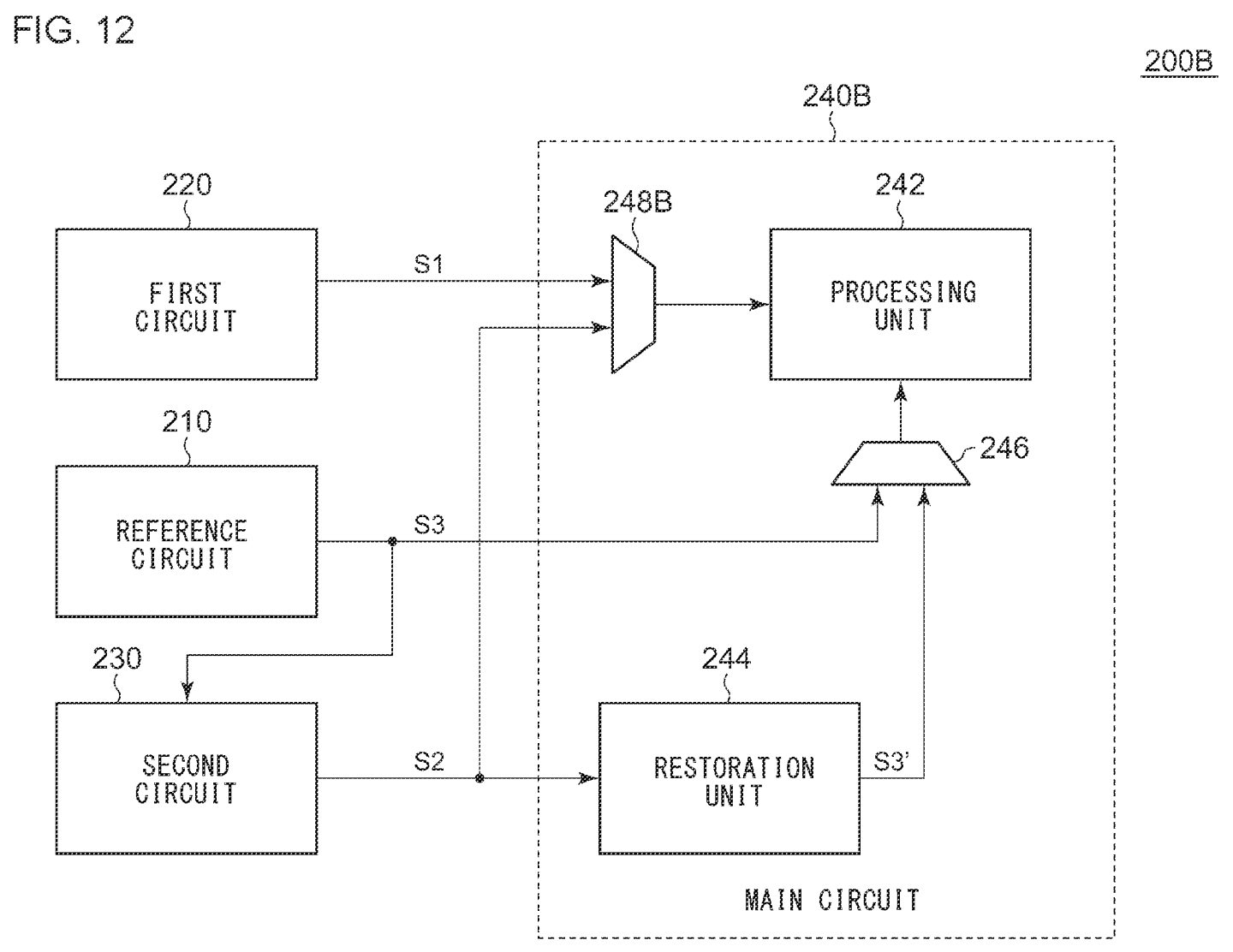

FIG. 12 is a circuit diagram of a modification (200B) of the semiconductor apparatus 200 shown in FIG. 9. In this modification, when an abnormal state has occurred in the first circuit 220, the processing unit 242 of the main circuit 240B operates according to the second signal S2 generated by the second circuit 230 instead of the first signal S1 generated by the first circuit 220.

The main circuit 240B includes a failsafe circuit 248B. The failsafe circuit 248B receives the first signal S1 and the second signal S2. During a period in which the first circuit 220 is operating normally, the failsafe circuit 248B supplies the first signal S1 to the processing unit 242. When an abnormal state has occurred in the first circuit 110, the failsafe circuit 248B supplies the second signal S2 to the processing unit 242.

The detection method supported by the failsafe circuit 248B for detecting an abnormal state in the first circuit 220 is not restricted in particular. For example, in the same manner as the failsafe circuit 248A shown in FIG. 11, the failsafe circuit 248B may detect an abnormal state in the first circuit 220 by executing reciprocal monitoring of the first signal S1 and the second signal S2. Also, the failsafe circuit 248B may monitor the reference signal S1 and may detect an abnormal state in the first circuit 220 based on the loss of the reference signal S1 or whether or not the signal characteristic thereof (e.g., frequency, signal level, duty cycle) is within a normal range.

With the semiconductor apparatus 200B shown in FIG. 12, this ensures functional safety by duplication with respect to a predetermined common function supported by the first circuit 220.

Modification 3

FIG. 13 is a circuit diagram of a modification (200C) of the semiconductor apparatus 200 shown in FIG. 9. In this modification, the failsafe circuit 246C of the main circuit 240C executes reciprocal monitoring of the reference signal S3 generated by the reference circuit 210 and the reference signal S3' restored by the restoration unit 244, so as to detect an abnormal state in the reference circuit 210. The abnormal state detection method is not restricted in particular. For example, the failsafe circuit 246C generates the expected value range of the reference signal S3 based on the reference signal S3'. When the reference signal S3 is within the expected value range, the failsafe circuit 246C judges that the reference circuit 210 is operating normally. Conversely, when the reference signal S3 is not within the expected value range, the failsafe circuit 246C judges that an abnormal state has occurred in the reference circuit 210.

Modification 4

As yet another modification, the semiconductor apparatus 200C shown in FIG. 13 may further include the failsafe circuit 248A shown in FIG. 11 as an additional component. Also, the semiconductor apparatus 200C shown in FIG. 13 may further include the failsafe circuit 248B shown in FIG. 12 as an additional component.

Usage

Figure 14:
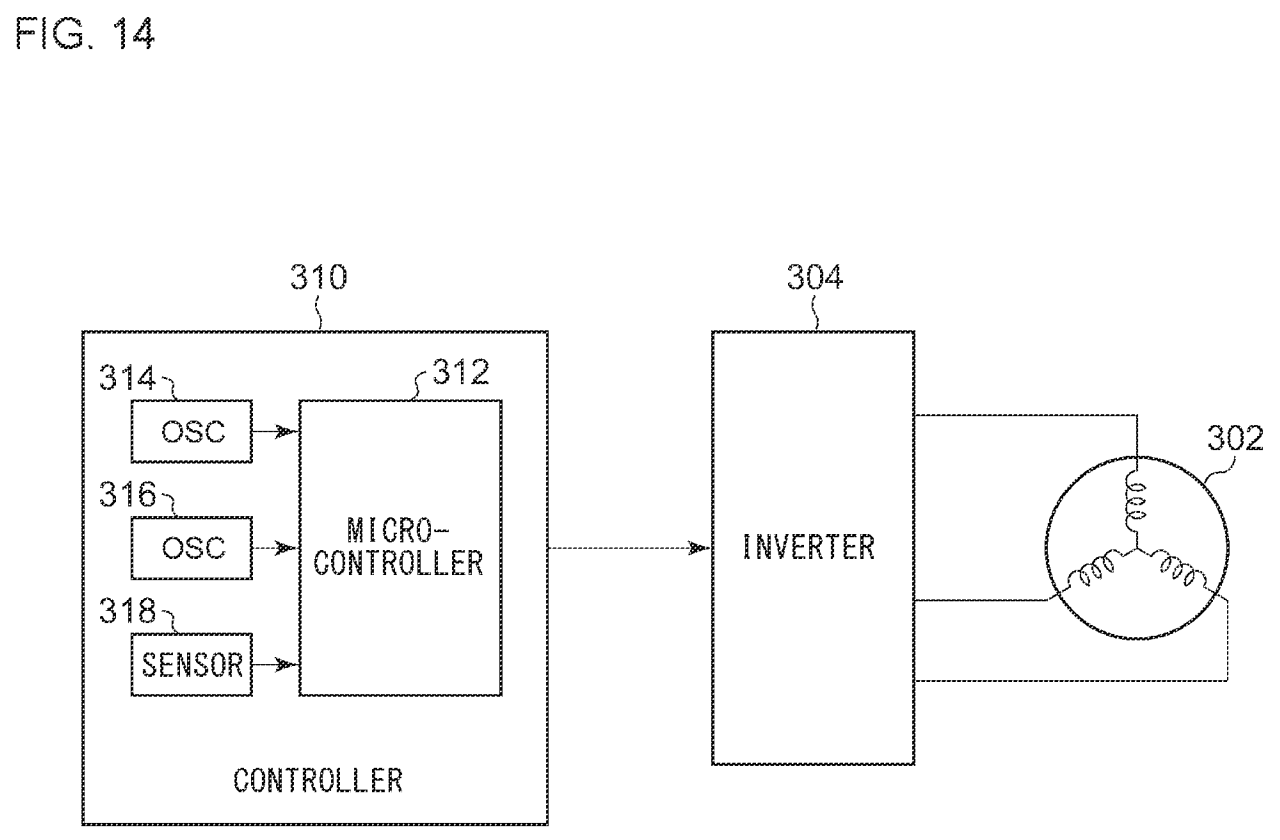

The usage of the semiconductor apparatuses 100 and 200 is not restricted in particular. Also, the semiconductor apparatuses 100 and 200 are preferably applicable to in-vehicle devices and vehicle devices that require severe functional safety. FIG. 14 is a diagram showing a motor control system 300.

The motor control system 300 includes a motor 302, an inverter 304, and a motor controller 310.

The motor controller 310 includes a microcontroller 312, oscillators 314 and 316, and a temperature sensor 318.

The motor controller 310 may be configured to have the architecture of the semiconductor apparatus 100 according to the embodiment 1. The microcontroller 312 corresponds to the main circuit 130. The oscillators 314 and 316 correspond to the first circuit 110 and the second circuit 120, respectively. The temperature sensor 318 corresponds to the sensor 140. With such an arrangement in which the microcontroller 312 is configured in the same manner as the main circuit 130D shown in FIG. 8, this provides a failsafe by duplication of the system clock. Furthermore, such an arrangement provides a failsafe by duplication with respect to the temperature sensing.

The embodiments have been described for exemplary purposes only. Rather, it can be readily conceived by those skilled in this art that various modifications may be made by making various combinations of the aforementioned components or processes, which are also encompassed in the technical scope of the present disclosure or the present invention.

NOTES

The following techniques are disclosed in the present specification.

Item 1

A semiconductor apparatus comprising:
a first circuit having a predetermined function, structured to generate an output having a relatively small dependence on a certain operation condition;
a second circuit having the same function as the first circuit, structured to generate an output having a relatively large dependence on the certain operation condition; and
a main circuit structured to operate according to the output of the first circuit when the first circuit operates normally, and to generate a detection signal indicative of the certain operation condition based on a relative relation between the output of the first circuit and the output of the second circuit.

14

Item 2

The semiconductor apparatus according to item 1, wherein the second circuit has a simplified structure as compared with that of the first circuit.

Item 3

The semiconductor apparatus according to item 1 or 2, wherein the main circuit is structured to monitor the output of the first circuit and the output of the second circuit so as to detect an abnormal state in the first circuit.

Item 4

The semiconductor apparatus according to any one of items 1 through 3, wherein, the main circuit is structured to operate according to the output of the second circuit when an abnormal state has occurred in the first circuit.

Item 5

The semiconductor apparatus according to any one of items 1 through 4, further comprising a sensor structured to detect the certain operation condition.

Item 6

The semiconductor apparatus according to item 5, wherein, the main circuit is structured to operate with reference to an output of the sensor when the sensor operates normally, and wherein the main circuit is structure to detect an abnormal state in the sensor based on a relation between the detection signal and the output of the sensor.

Item 7

The semiconductor apparatus according to item 5 or 6, wherein, the main circuit is structured to operates with reference to the output of the sensor when the sensor operates normally,
and wherein the main circuit is structured to operate with reference to the detection signal when an abnormal state has occurred in the sensor.

Item 8

The semiconductor apparatus according to any one of items 1 through 7, wherein the certain operation condition is temperature.

Item 9

The semiconductor apparatus according to item 8, wherein the predetermined function is generation of a clock signal,
wherein the first circuit is a first oscillator, and the second circuit a second oscillator,
and wherein a temperature dependence of an oscillation frequency of the second oscillator is larger than that of the first oscillator.

Item 10

The semiconductor apparatus according to item 8, wherein the predetermined function is generation of a constant voltage,

wherein the first circuit is a reference voltage source, and
    the second circuit is a voltage source is employed,
and wherein a temperature dependence of an output
    voltage of the voltage source is larger than that of the
    reference voltage source.

Item 11

A semiconductor apparatus comprising:
a reference circuit structured to generate a predetermined
    reference signal;
a first circuit having a predetermined function, and struc-
    tured to operate independently of the reference signal;
a second circuit having the same function as that of the
    first circuit, and structured to generate an output that
    depends on the reference signal; and
a main circuit structured to operate according to an output
    of the first circuit and the reference signal when the first
    circuit and the reference circuit operate normally, and
    to restore the reference signal from the output of the
    second circuit.

Item 12

The semiconductor apparatus according to item 11,
wherein the main circuit is structured to monitor the refer-
ence signal generated by the reference circuit and the
restored reference signal so as to detect an abnormal state in
the reference circuit.

Item 13

The semiconductor apparatus according to item 11 or 12,
wherein the main circuit is structured to operate according to
the restored reference signal when an abnormal state has
occurred in the reference circuit.

Item 14

The semiconductor apparatus according to any one of
items 11 through 13, wherein the main circuit is structured
to monitor an output of the first circuit and an output of the
second circuit so as to detect an abnormal state in the first
circuit.

Item 15

The semiconductor apparatus according to any one of
items 11 through 14, wherein the main circuit is structured
to operate according to the output of the second circuit when
an abnormal state has occurred in the first circuit.

Item 16

The semiconductor apparatus according to any one of
items 11 through 15, wherein the reference circuit is a
reference voltage source structured to generate a reference
voltage,
    wherein the first circuit is a first oscillator structured to
        generate a first clock signal,
    wherein the second circuit is a second oscillator structured
        to generate a second clock signal having a time-average
        level that corresponds to the reference voltage,
    and wherein the main circuit is structured to smooth the
        second clock signal so as to restore the reference signal.

Item 17

The semiconductor apparatus according to any one of
items 1 through 16, monolithically integrated on a single
semiconductor substrate.

Item 18

An in-vehicle apparatus provided with the semiconductor
apparatus according to any one of items 1 through 17.
    What is claimed is:
    1. A semiconductor apparatus comprising:
    a first circuit having a predetermined function, structured
        to generate an output having a relatively small depen-
        dence on a certain operation condition;
    a second circuit having the same function as the first
        circuit, structured to generate an output having a rela-
        tively large dependence on the certain operation con-
        dition; and
    a main circuit structured to operate according to the
        output of the first circuit when the first circuit operates
        normally, and to generate a detection signal indicative
        of the certain operation condition based on a relative
        relation between the output of the first circuit and the
        output of the second circuit,
        wherein the certain operation condition is temperature,
    wherein the predetermined function is generation of a
        clock signal,
    wherein the first circuit is a first oscillator, and the second
        circuit is a second oscillator,
    and wherein a temperature dependence of an oscillation
        frequency of the second oscillator is larger than that of
        the first oscillator.
    2. The semiconductor apparatus according to claim 1,
wherein the second circuit has a simplified structure as
compared with that of the first circuit.
    3. The semiconductor apparatus according to claim 1,
wherein the main circuit is structured to monitor the output
of the first circuit and the output of the second circuit so as
to detect an abnormal state in the first circuit.
    4. The semiconductor apparatus according to claim 1,
wherein the main circuit is structured to operate according to
the output of the second circuit when an abnormal state has
occurred in the first circuit.
    5. The semiconductor apparatus according to claim 1,
further comprising a sensor structured to detect the certain
operation condition.
    6. The semiconductor apparatus according to claim 5,
wherein the main circuit is structured to operate with refer-
ence to an output of the sensor when the sensor operates
normally,
    and wherein the main circuit is structured to detect an
        abnormal state in the sensor based on a relation
        between the detection signal and the output of the
        sensor.
    7. The semiconductor apparatus according to claim 5,
wherein the main circuit is structured to operate with refer-
ence to the output of the sensor when the sensor operates
normally,
    and wherein the main circuit is structured to operate with
        reference to the detection signal when an abnormal
        state has occurred in the sensor.
    8. The semiconductor apparatus according to claim 1,
monolithically integrated on a single semiconductor sub-
strate.
    9. An in-vehicle apparatus provided with the semicon-
ductor apparatus according to claim 1.

10. A semiconductor apparatus comprising:

a first circuit having a predetermined function, structured to generate an output having a relatively small dependence on a certain operation condition;

a second circuit having the same function as the first circuit, structured to generate an output having a relatively large dependence on the certain operation condition; and a main circuit structured to operate according to the output of the first circuit when the first circuit operates normally, and to generate a detection signal indicative of the certain operation condition based on a relative relation between the output of the first circuit and the output of the second circuit, wherein the certain operation condition is temperature, wherein the predetermined function is generation of a constant voltage, wherein, the first circuit is a reference voltage source, and the second circuit is a voltage source, and wherein a temperature dependence of an output voltage of the voltage source is larger than that of the reference voltage source.

11. A semiconductor apparatus comprising:

a reference circuit structured to generate a predetermined reference signal;

a first circuit having a predetermined function, and structured to operate without depending on the reference signal;

a second circuit having the same function as that of the first circuit, and structured to provide an output that depends on the reference signal; and a main circuit structured to be capable of operating according to an output of the first circuit and the reference signal when the first circuit and the reference circuit are operating normally, and of restoring the reference signal from the output of the second circuit.

12. The semiconductor apparatus according to claim 11, wherein the main circuit monitors the reference signal generated by the reference circuit and the restored reference signal so as to detect an abnormal state in the reference circuit.

13. The semiconductor apparatus according to claim 11, wherein, when an abnormal state has occurred in the reference circuit, the main circuit operates according to the restored reference signal.

14. The semiconductor apparatus according to claim 11, wherein the main circuit monitors an output of the first circuit and an output of the second circuit so as to detect an abnormal state in the first circuit.

15. The semiconductor apparatus according to claim 11, wherein, when an abnormal state has occurred in the first circuit, the main circuit operates according to the output of the second circuit.

16. The semiconductor apparatus according to claim 11, wherein, the reference circuit is a reference voltage source structured to generate a reference voltage, wherein the first circuit is a first oscillator structured to generate a first clock signal, wherein the second circuit is a second oscillator structured to generate a second clock signal having a time-average level that corresponds to the reference voltage, and wherein the main circuit is structured to smooth the second clock signal so as to restore the reference signal.

17. The semiconductor apparatus according to claim 11, monolithically integrated on a single semiconductor substrate.

18. An in-vehicle apparatus provided with the semiconductor apparatus according to claim 11.

* * * * *